US008018980B2

United States Patent
Deri et al.

(10) Patent No.: US 8,018,980 B2
(45) Date of Patent: Sep. 13, 2011

(54) LASER DIODE PACKAGE WITH ENHANCED COOLING

(75) Inventors: Robert J. Deri, Pleasanton, CA (US); Jack Kotovsky, Oakland, CA (US); Christopher M. Spadaccini, Oakland, CA (US)

(73) Assignee: Lawrence Livermore National Security, LLC, Livermore, CA (US)

( * ) Notice: Subject to any disclaimer, the term of this patent is extended or adjusted under 35 U.S.C. 154(b) by 0 days.

(21) Appl. No.: 12/693,052

(22) Filed: Jan. 25, 2010

(65) Prior Publication Data

US 2011/0182309 A1    Jul. 28, 2011

(51) Int. Cl.
*H01S 3/04* (2006.01)
(52) U.S. Cl. .................. 372/34; 372/35; 372/36
(58) Field of Classification Search ........... 372/34–35
See application file for complete search history.

(56) References Cited

U.S. PATENT DOCUMENTS

| 5,315,154 A | 5/1994 | Elwell |
| 5,828,683 A | 10/1998 | Freitas |
| 2004/0057479 A1 * | 3/2004 | Stephens et al. ............... 372/36 |
| 2006/0067373 A1 * | 3/2006 | Alander ........................... 372/34 |
| 2006/0088271 A1 | 4/2006 | Ghoshal |
| 2010/0175756 A1 * | 7/2010 | Weihs et al. .................. 136/259 |

FOREIGN PATENT DOCUMENTS

| EP | 0461544 A1 | 12/1991 |
| EP | 0987799 A2 | 3/2000 |
| JP | 62186437 U | 11/1987 |
| JP | 2004152905 A | 5/2004 |
| WO | WO 2009/058269 A1 | 5/2009 |

OTHER PUBLICATIONS

Vetrovec, J., "Quasi-Passive Heat Sink for High-Power Laser Diodes", Proc SPIE, vol. 7198, 71980D, 2009, 10 pages.
International Search Report and Written Opinion for PCT Patent Application No. PCT/US2011/022443 mailed on Jun. 8, 2011, 20 pages.

* cited by examiner

*Primary Examiner* — Dung T Nguyen

(57) ABSTRACT

A laser diode package assembly includes a reservoir filled with a fusible metal in close proximity to a laser diode. The fusible metal absorbs heat from the laser diode and undergoes a phase change from solid to liquid during the operation of the laser. The metal absorbs heat during the phase transition. Once the laser diode is turned off, the liquid metal cools off and resolidifies. The reservoir is designed such that that the liquid metal does not leave the reservoir even when in liquid state. The laser diode assembly further includes a lid with one or more fin structures that extend into the reservoir and are in contact with the metal in the reservoir.

13 Claims, 6 Drawing Sheets

| | Thermal Properties employed for Gallium | | | |
|---|---|---|---|---|
| temp range (K) | Phase | rho (g/cc) | C (J/K-kg) | K (W/m-K) |
| T<302 | Solid | 5.904 | 370.9 | 40.6 |
| T=302~303 K | Phase Change | 6.095 | 80,561 | 35.7 |
| T>303 | Liquid | 6.116 | 360 | 28.1 |

| Lid Properties | | ΔTmax (K) | | |
|---|---|---|---|---|
| Thickness (μm) | Material | t=200 μs | t=360 μs | t=1000 μs |
| 100 | CuW | 1.25 | 3.09 | 3.30 |
| 20 | CuW | 5.29 | 5.30 | -0.28 |
| 10 | Diamond Type II | 6.69 | 6.08 | -0.53 |
| 0 | none | 6.10 | 5.21 | |

| Gallium | Lid Properties | | ΔTmax (K) | 250 W pulse |
|---|---|---|---|---|
| Thickness (um) | Thickness (um) | Material | t=360 μs | t=1000 μs |
| 200 | 100 | CuW | 3.62 | 3.62 |
| 200 | 20 | CuW | 5.05 | 5.37 |
| 200 | 10 | Diamond Type II | 5.99 | 5.90 |
| 100 | 0 | none | 5.87 | 5.51 |
| 100 | 10 | Diamond Type II | 6.00 | 5.96 |
| 50 | 10 | Diamond Type II | 6.07 | 6.11 |

LASER DIODE PACKAGE WITH ENHANCED COOLING

STATEMENT AS TO RIGHTS TO INVENTIONS MADE UNDER FEDERALLY SPONSORED RESEARCH OR DEVELOPMENT

The United States Government has rights in this invention pursuant to Contract No. DE-AC52-07NA27344 between the U.S. Department of Energy and Lawrence Livermore National Security, LLC, for the operation of Lawrence Livermore National Laboratory.

BACKGROUND OF THE INVENTION

Laser diode arrays are used in a wide range of commercial, medical and military applications: materials processing (soldering, cutting, metal hardening), display technology/graphics, medical surgical procedures (corneal shaping, tissue fusion, dermatology, photodynamic therapy), satellite communication, remote sensing and laser isotope separation. In certain solid-state laser applications it is desirable to use laser diode arrays to optically excite, i.e., "pump," the crystal hosts. Diodes offer a narrow band of emission (reducing thermal lensing), compactness, high electrical efficiency and higher reliability as compared to flash lamps. Despite these numerous advantages, however, diode-pumped solid-state lasers (DPSSLs) have gained slow market acceptance due to the high cost associated with the laser diode array pumps. Significant diode array cost reductions would enable wide deployment of DPSSLs and new architectures to be realized that were previously cost prohibitive. In particular, low-cost diode arrays would bolster the inertial confinement fusion (ICF) and inertial fusion energy (IFE) programs that require low-repetition rate laser diode arrays in very high volumes.

Laser diode arrays dissipate a large amount of heat that needs to be effectively channeled away from the diodes. One of the methods to control the costs of the laser diodes is to generate more optical power out of each diode. As the amount of optical power outputted from each diode increases, the cost of running a laser diode array decreases—i.e. the cost per watt of power decreases. However, the downside to running the laser diodes at increased optical output is that they generate enormous amounts of heat that need to be dissipated. Consequently, advanced heat abatement mechanisms are needed in order to run laser diode arrays at increased outputs. This in-turn increases the cost of packaging a laser diode since more effective cooling of the laser diodes is needed.

What is needed is a low cost package that effectively dissipates the heat generated by the laser diode when the laser diode is operated at elevated optical output power.

SUMMARY OF THE INVENTION

This disclosure generally relates to device packaging. More specifically, the disclosure relates to techniques for providing advanced heat dissipation in a laser diode package.

Certain embodiments of the present invention provide a laser diode package for improving the heat dissipation from the laser diode. The package includes a substrate having a lower surface, an upper surface, and a height. The package further includes a region disposed within the substrate. The region includes a fusible material that has a solid state and a liquid state. The region has an upper surface and an opposing lower surface, wherein the upper surface of the region is flush with the upper surface of the substrate and the lower surface of the region is separated from the upper surface of the region by a first distance that is less than the height of the substrate. A cover plate is disposed on the substrate such that the bottom surface of the cover plate is in contact with the upper surface of the substrate and the upper surface of the region. In addition, the package includes a laser diode coupled to the top surface of the cover plate. During the operation of the laser diode, the fusible material melts and transitions into the liquid state. In the liquid state the fusible material is confined within the region. In some embodiments, the fusible material can include non-metallic materials like paraffin.

Other embodiments of the present invention provide an array of laser diode chips. The laser diode chip array includes a substrate having an upper surface and a lower surface and a plurality of v-grooves are formed in the upper surface. A plurality of laser diode bar assemblies is placed within the v-grooves, wherein a single laser diode bar is placed in each of the v-grooves. Each laser diode bar assembly further includes a thermal plate having a height and a width, a cavity disposed within an upper region of the thermal plate, the cavity having a first predetermined height and a second predetermined width and at least partially filled with fusible metal. The second predetermined width of the cavity is less than the width of the thermal plate and the first predetermined height of the cavity is less than the height of the thermal plate. The laser diode assembly further includes a cover plate disposed on the thermal plate and a laser diode bar coupled to the cover plate.

In yet other embodiments, the laser diode package includes a vertically oriented mount substrate having a first side surface and a second side surface, a reservoir filled with a fusible metal disposed within the mount substrate and located near the first side surface of the mount substrate. The reservoir is characterized by a volume. A laser diode bar is attached to the first side surface of the mount substrate and a metal plate is attached to the laser diode bar.

In some embodiments, a laser diode package is provided. The laser diode package includes a mount substrate having a lower surface, an upper surface, and a first height. The laser diode package further includes a region disposed within the mount substrate and along the upper surface and the region is filled with a fusible metal wherein the region has a second height that is less than the first height of the substrate. A cover plate having a top surface and a bottom surface is disposed on the substrate. The cover plate includes a plurality of fin structures along the bottom surface wherein the plurality of fin structures extend into the region and are in contact with the fusible metal. A laser diode bar is coupled to the top surface of the cover plate.

The following detailed description, together with the accompanying drawings will provide a better understanding of the nature and advantages of the present invention.

DETAILED DESCRIPTION OF SPECIFIC EMBODIMENTS

Embodiments of the invention generally relate to laser diodes and specifically to methods and a system for cooling a laser diode assembly.

Figure 1:
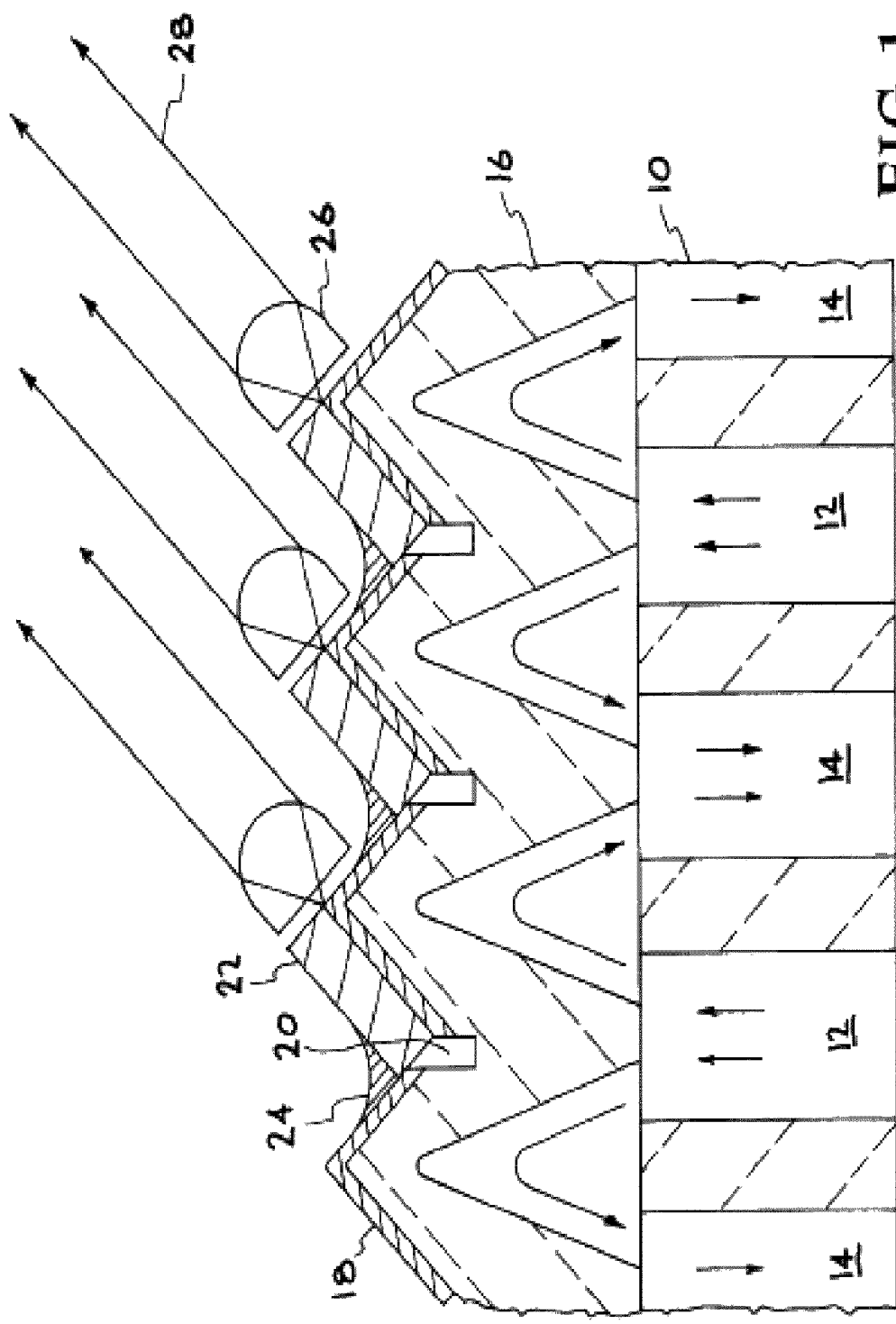
FIG. 1 illustrates laser diodes placed in a series of v-grooves of a conventional micro-channel cooled submount.

FIG. 1 shows a plurality of laser diode bars placed onto a microchannel cooled type sub-mount in a series of v-grooves according to a conventional design. FIG. 1 shows the electrical circuitry, and microlens placement. Water manifold 10, comprising inlet ports 12 and exit ports 14, is connected to the angular groove microchannel cooler 16. In the figure, water enters and exits angular groove microchannel cooler 16 through inlet ports 12 and exit ports 14, respectively. Angular groove microchannel cooler 16 comprises metalization layer 18, which has its electrical continuity broken by electrical isolation break 20. Laser diode bars 22 are located against the metalization layer 18 and are soldered into place. The electrical conduction path is completed with Copper foil fingers 24 coupling the top side of the laser diode chip to the metallization layer 18. Microlenses 26 are located in proximity to the output face of laser diode bars 22 such that the output beam 28 is collimated.

Most of the conventional cooling techniques involving use of a liquid to cool devices such as laser diodes involve circulation of the liquid in a closed loop system, e.g., as illustrated in FIG. 1 above. Examples of such liquid cooling mechanisms include micro-fluidic channels that circulate a cooling liquid, and the like. In sum, most of the cooling techniques in use today are focused on delivering the cooling liquid near the surface to be cooled, transferring the heat to the liquid, transporting the heated liquid away from the surface, cooling the liquid, and delivering the cooled liquid back near the surface. Implementing such a cooling scheme requires added infrastructure of creating a closed loop system for the fluid to circulate. While this may not be a problem when there is only one device or few devices that need the cooling, however, it may result in significant cost impact when hundreds of thousands of devices need cooling at the same time. For example, a laser diode array used in a nuclear fusion engine may include millions of laser diodes. Using a closed loop liquid cooling system in close proximity to the laser diodes for such an array may not be practical or feasible.

Embodiments of the present invention relate to methods for cooling a laser diode assembly. In some embodiments, the laser diode has a short duty cycle. For example, the duty cycle of the laser diode can range between 1% and 10%. Duty cycle of a laser diode is the proportion of time during which the laser diode is operated or turned 'on'. For example, if a laser diode operates for 1 second, and is shut off for 99 seconds, then it is operated for 1 second again, and so on, then the laser diode is operational for one out of 100 seconds, or $\frac{1}{100}$ of the time, and its duty cycle is therefore $\frac{1}{100}$, or 1 percent. There is a need to effectively channel the heat away from the laser diode when the laser diode is "on." In some embodiments, a fusible metal is placed in close proximity to the laser diode. When the diode is turned on, the heat generated by the laser diode will result in a phase change of the fusible metal, e.g., solid to liquid. During this phase change, the fusible metal absorbs a large amount of heat thus effectively channeling the generated heat away from the laser diode. During the period when the laser diode is off, the fusible metal can transfer the absorbed heat to other heat abatement systems, e.g. a heat sink, and resolidify again. In such an instance, the added expense and complexity of circulating liquid cooling systems can be avoided thus reducing the packaging costs for the laser diode.

Figure 2:
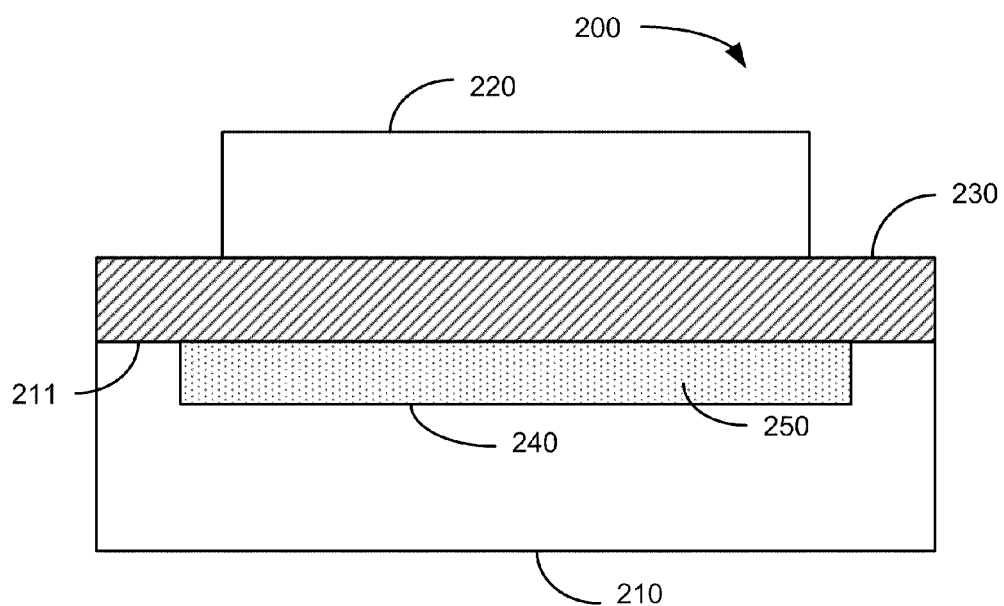
FIG. 2 illustrates laser diodes with a modified heat dissipation mechanism according to a first embodiment of the present invention.

FIG. 2 illustrates a cross-sectional view of a laser diode assembly 200 according to an embodiment of the present invention. Assembly 200 includes a heat spreader structure 210. In some embodiments, heat spreader structure 210 is in the form of a metal plate. In some embodiments, the heat spreader structure 210 is made from materials including Copper and Tungsten. Other suitable materials may also be used based on the application, e.g., ceramic, Beryllium oxide, or Aluminum oxide. In some embodiments, heat spreader 210 has a thickness (height) of about between 250 µm and 2000 µm and a width of about between 500 µm and 1 cm. Heat spreader 210 has a cavity 240 formed along an upper surface 211 of the heat spreader. Cavity 240 has a thickness (height) that is less than the thickness of heat spreader 210 and a width that is less than the width of the heat spreader. Thus, the cavity is contained within the heat spreader. In some embodiments, the height of cavity 240 is between 40 µm and 200 µm. In an exemplary embodiment, the height of cavity 240 is about 50 µm. Cavity 240 is filled with a fusible metal 250 that can undergo phase change with absorption of heat. In some embodiments, cavity 240 is filled with a fusible metal, e.g., Gallium. A lid 230 is disposed over cavity 240 and surface 211 of heat spreader 210 such that lid 230 seals cavity 240. Lid 230 is manufactured from materials including but not limited to Copper, Diamond, Tungsten, Aluminum Nitride, and combinations thereof. In some embodiments, the height or thickness of lid 230 is between 300 µm to less than 100 µm. A laser diode 220 is mounted on top of lid 230. Laser diode 220 can be a laser diode comprising epitaxial layers of indium-Gallium-Aluminum-Arsenide-phosphide (In-GaAlAsP) grown on a Gallium-Arsenide (GaAs) substrate.

In operation, the laser diode is turned on and off according to the duty cycle required by the application. As discussed above, the laser diode is operated in a short duty cycle mode. For example, in one embodiment, the laser diode is operated in a pulsed mode with the laser diode being operated with 350 µs bursts. When the laser diode is turned on, the laser diode generates a significant amount of heat. Most of the heat is generated extremely close to the interface between laser diode 220 and lid 230. In one embodiment, the laser diode generates up to 5 kW/cm² of heat during a single burst. In one embodiment, the temperature rise of laser diode 220 is minimized when laser diode 220 is operational. In this embodiment, during operation of laser diode 220, the heat generated by the laser diode is absorbed by the Gallium and causes the Gallium in cavity 240 to melt. This helps to maintain the temperature of laser diode 220 at a constant level. When the laser diode is off, the Gallium re-solidifies after transferring the absorbed heat to heat spreader 210 and surrounding structures. However, the Gallium stays within the cavity even when it is melted and does not leave cavity 240.

Figures 4, 5:
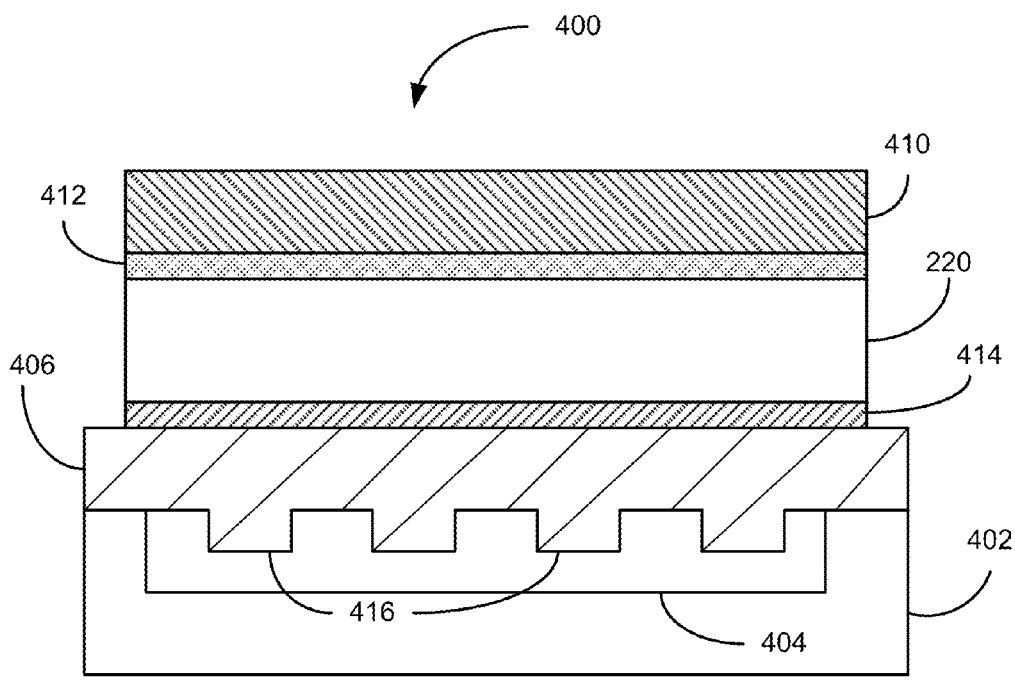
FIG. 4 is a simplified cross-sectional view of a laser diode assembly according to a third embodiment of the present invention.
FIG. 5 shows a table listing the thermal properties of Gallium used in various embodiments of the present invention.

In one embodiment, Gallium undergoes two phase transformations during each cycle of the laser diode operation. First, when the laser diode is on, the Gallium undergoes a first phase transformation from a solid phase to a liquid (molten) phase. Second, during the idle mode or when the laser diode is off, the Gallium metal undergoes a second phase transformation from the liquid (molten) state back to a solid state. In some embodiments, the Gallium may never re-solidify completely but may only attain a partially solid state. FIG. 5 shows a table 500 illustrating properties of Gallium during various phases of the Gallium. As shown in table 500, thermal properties of a material depend on the density ($\rho$ (rho)), specific heat capacity (C), and thermal conductivity (K) of the material. More specifically, metals with a high value for the product of the density, specific heat capacity, and thermal conductivity of a material ($\rho$CK) have better heat conduction capability in short duty cycle applications. As illustrated in table 500, Gallium has relatively low specific heat capacity during the solid and the liquid phases; however, during the phase transition from solid to liquid, Gallium behaves like a material with a substantially high specific heat capacity due to its latent heat of fusion, thus increasing its heat absorption capacity significantly. Gallium is one of the metals that can be used effectively to conduct heat away from the laser diode. One skilled in the art will realize that there are other metals that may also be used, e.g., alloys of Gallium, Bismuth, Indium, and Tin. In some embodiments, the temperature at which the high heat capacity is achieved can be adjusted over a significant temperature range by varying the composition of the fusible metal. In some embodiments, the composition of the fusible metal determines its melting temperature. For example, the melting temperature of the fusible metal can be adjusted between 14° C. (287 K) to above 40° C. (313 K) by varying the composition of the fusible metal. The requirement for having a particular melting temperature for the fusible metal may depend on the application and duty cycle of the laser diode.

It is to be noted that cavity 240 need not be filled only with a fusible metal. In some embodiments, a combination of fusible and non-fusible metal may be used. For instance, in one embodiment, instead of just Gallium, a composite structure including Copper and Gallium can be used. In this instance, a Copper plate with pores is created. The structure of the Copper plate is similar to foam. Gallium can then be embedded in the pores of the Copper plate. This creates a composite structure that comprises Copper with Gallium (or other suitable material) embedded therein. One of the advantages of this type of structure is that since Copper is a good conductor of heat, it helps to carry the generated heat from the laser diode to solid metal in regions farther from the laser diode in order to aid the Gallium in absorbing the heat. So in effect, the Copper acts as a heat conduit to effectively and uniformly channel the heat to the Gallium so that Gallium may perform its function effectively.

In some embodiments, cavity 240 can be filled with a solid paraffin fusible material. For materials that have increased heat absorption capacity during their phase transition from solid to liquid, it is advantageous to always have the solid material in contact with or in close proximity to the surface generating the heat. In this instance, it would be beneficial to have a portion of the solid fusible material in close proximity to the laser diode so that the portion of the solid fusible material closest to the laser diode junction will melt thus absorbing the heat generated by the laser diode. In one embodiment, the fusible material within cavity 240 can be circulated so as to have some solid portion of the fusible material in close proximity of the laser diode junction at any given time. This will increase the heat absorption capacity of the fusible material. In order to accomplish this, in an embodiment, when the solid fusible material near the laser diode junction melts it is carried away from the laser diode junction, e.g., towards the bottom of cavity 240. This forces the solid material that was at the bottom of cavity 240 to move up and come in close proximity of the laser diode junction. While the solid material, which is pushed up, is melting due to absorption of heat the liquid material that is pushed down towards the bottom of cavity 240 can cool, resolidify, and be ready to be pushed up towards the laser diode junction. This creates a closed loop system within cavity 240 such that there is always some solid portion of the fusible material in close proximity to the laser diode junction. This increases the efficiency of the fusible material in carrying heat away from the laser diode by taking advantage of the constant phase change occurring at the laser diode junction.

Figure 3:
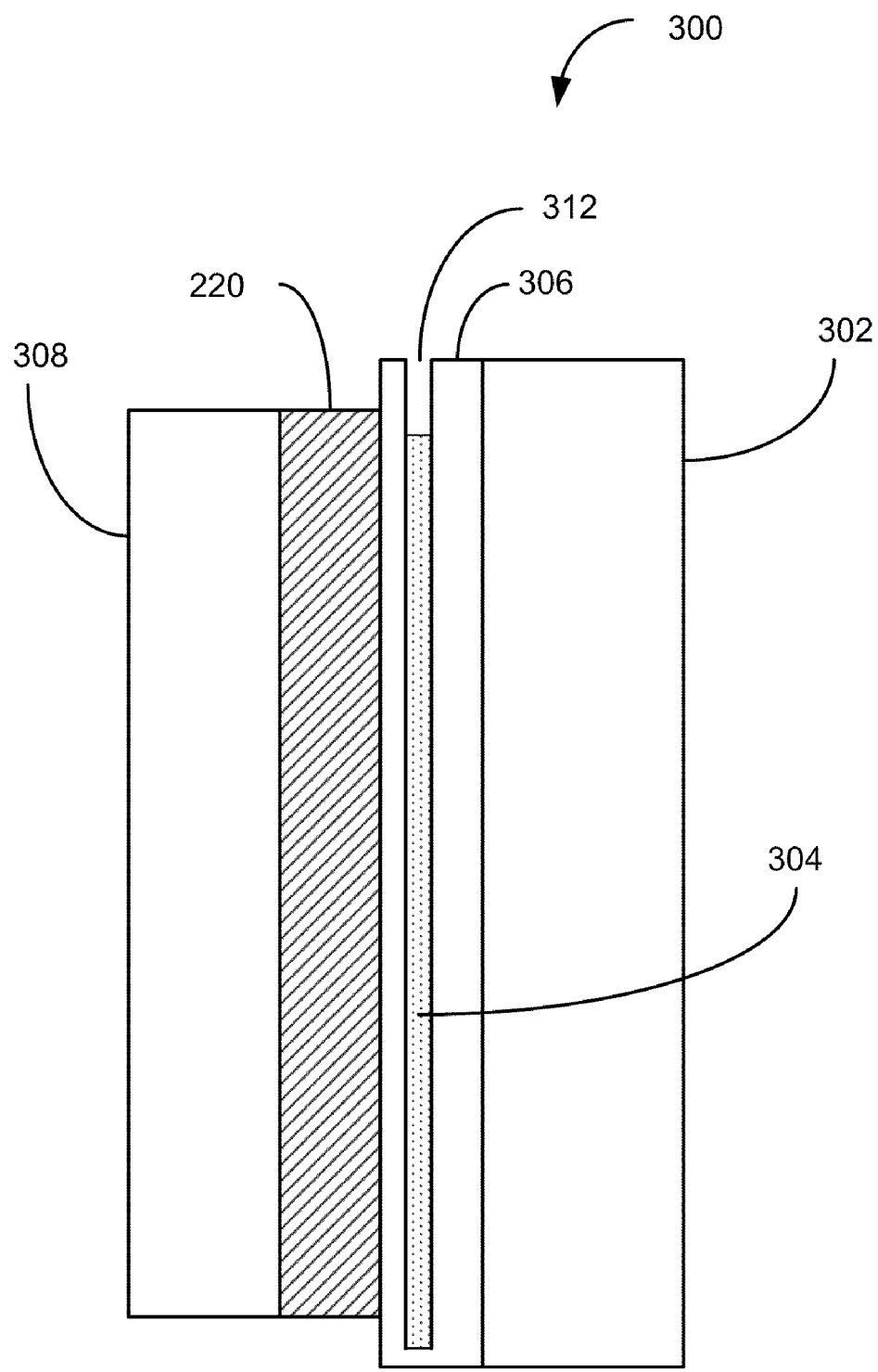
FIG. 3 is a simplified cross-sectional view of a laser diode assembly according to a second embodiment of the present invention.

FIG. 3 illustrates a laser diode package assembly 300 according to another embodiment of the present invention. In this embodiment, assembly 300 includes a substrate 302. Substrate 302 is vertically orientated and may include Copper or an alloy including Copper. Substrate 302 acts a heat sink to conduct the heat away from the laser diode. A lid 306 is coupled to substrate 302. An upper portion of lid 306 includes a reservoir 312. Reservoir 312 is embedded in lid 306 and can be formed using any of the conventional techniques. Reservoir 312 is at least partially filled with a fusible metal 304. Metal 304 is in a solid state or partially solid state when the laser diode is in the idle state. Metal 304 absorbs the heat generated by laser diode 220 and changes its phase from solid to liquid. However, since the reservoir is vertically oriented, the melted metal 304 does not leave the reservoir due to gravity. Reservoir 312 is not completely filled with metal 304 in order to accommodate the expansion of metal 304 during its phase transition from solid to liquid. In some embodiments, metal 304 is Gallium. In other embodiments, metal 304 may comprise a composite structure of a fusible and non-fusible metal, e.g., Gallium and Copper, or Copper foam with Gallium embedded in the Copper foam. The Copper foam may be formed using multiple interwoven Copper filaments. In some embodiments, lid 306 is made from an alloy including Copper and Tungsten or an alloy including Copper and Diamond. A laser diode 220 is coupled to lid 306. The heat generated by laser diode 220 is coupled to substrate 302 via lid 306. In some embodiments a contact plate 308 is connected to laser diode 220. In some embodiments, contact plate 308 includes Copper. In operation, contact plate 308 provides the electrical power needed for operation of laser diode 220.

In operation, when laser diode 220 is on, the heat generated by laser diode 220 is absorbed by metal 304 which results in metal 304 changing its state from a solid phase to a liquid phase. However, since reservoir 312 is vertically oriented, the melted metal 304 does not leave the reservoir and the reservoir has enough headspace to accommodate any expansion of the metal as it undergoes the phase change. When laser diode 220 is off, metal 304 cools and resolidifies by channeling the heat to substrate 302. In the instance where metal 304 is Gallium, it is known that if Gallium is cooled slowly below its melting point, it does not re-solidify unless it is seeded with solid material. In some embodiments, reservoir is designed in such as manner that the Gallium in the reservoir does not completely melt. Thus, some amount of solid Gallium is always available to initiate the resolidifying process when the laser diode is off. In some embodiments, the resolidification process may occur in between 1 μs to 3 μs. In another embodiment, in order to enable the rapid exchange of heat from the laser diode to the metal, metal 304 may be confined in the reservoir using a flexible membrane at the interface between the laser diode and the lid. In some embodiments, the membrane can be made from material including Silicone rubber.

In some embodiments, the top of reservoir 312 is covered with a plate having an opening to provide further confinement of the Gallium and to prevent contamination caused by foreign particles entering the reservoir. In one embodiment, the plate can be sealed once the fusible metal is introduced into the reservoir via the opening in the plate.

FIG. 4 illustrates a laser diode package assembly 400 according to yet another embodiment of the present invention. Assembly 400 includes a heat sink 402. Heat sink 402 can be made from Copper or any other suitable material. Heat sink 402 serves to conduct heat away from materials to which heat sink 402 is coupled. A reservoir 404 is formed in an upper portion of heat sink 402. Reservoir 404 is filled with a metal that can undergo a phase change from solid to liquid upon absorption of heat. In some embodiments, reservoir 404 is filled with Gallium, although other suitable metals may also be used as described above. A lid 406 is coupled to heat sink 402 such that it is disposed over reservoir 404 and heat sink 402. In some embodiments, reservoir 404 is formed such that it is completely contained between heat sink 402 and lid 406. Lid 406 includes a plurality of "fin" structures 416 protruding from a bottom surface of lid 406 and partially extending into reservoir 404. Fin structures 416 extend to a fixed distance into reservoir 404. In some embodiments, fin structures 416 are between 30 μm and 50 μm thick and extend to distance of between 100 μm and 250 μm into reservoir 404. In an exemplary embodiment, fin structures 416 are 40 μm thick and extend to a distance of about 200 μm into the reservoir. The distance to which the fin structures extend into the reservoir is calculated from the top surface of the reservoir. In some embodiments, fin structures 416 are spaced apart by a distance of between 10 μm to about 70 μm. In some embodiments, the center-to-center distance between two adjacent fins is between 50 μm and 100 μm. In some embodiments, the number of fin structures 416 can range between 50 and 250. Fin structures 416 reduce the transport distance for the heat and increase the effective surface area for heat transport into reservoir 404.

A laser diode 220 is attached to lid 406 using a first solder material 414. In some embodiments, first solder material 414 includes Gold and Tin. In some embodiments, a metal plate electrode 410 is attached to laser diode 220 using a second solder material 412. In some embodiments, second solder material 412 includes Indium. Metal plate 410 is used to provide electrical connection to laser diode 220. In some embodiments, heat sink 402 is coupled to lid 406 using an Indium-based solder material.

The reservoir including the heat absorbing metal is kept as close to the laser diode junction as possible. As the distance between the reservoir and the diode junction increases, the reservoir becomes less effective at removing heat due to the increasing thermal impedance from the reservoir to the junction. It is beneficial if the reservoir can be placed in close proximity to the diode junction. One way of accomplishing this is to make the lid as thin as possible while still maintaining the structural integrity required for mounting the laser diode. In some embodiments, the lid thickness is maintained below 100 μm. In another embodiment, the lid can be fabricated using high thermal conductivity materials, e.g., Copper, Diamond, Graphite, etc. in order to minimize the thermal impedance of the lid. In some embodiments, the reservoir can be plated with metals including nickel or coated with Diamond-like carbon material to prevent the corrosion of the surrounding materials due to Gallium. In some embodiments, the reservoir may be formed using materials such as, silicon, beryllium oxide, or various types of ceramics.

Figures 6, 7, 8:
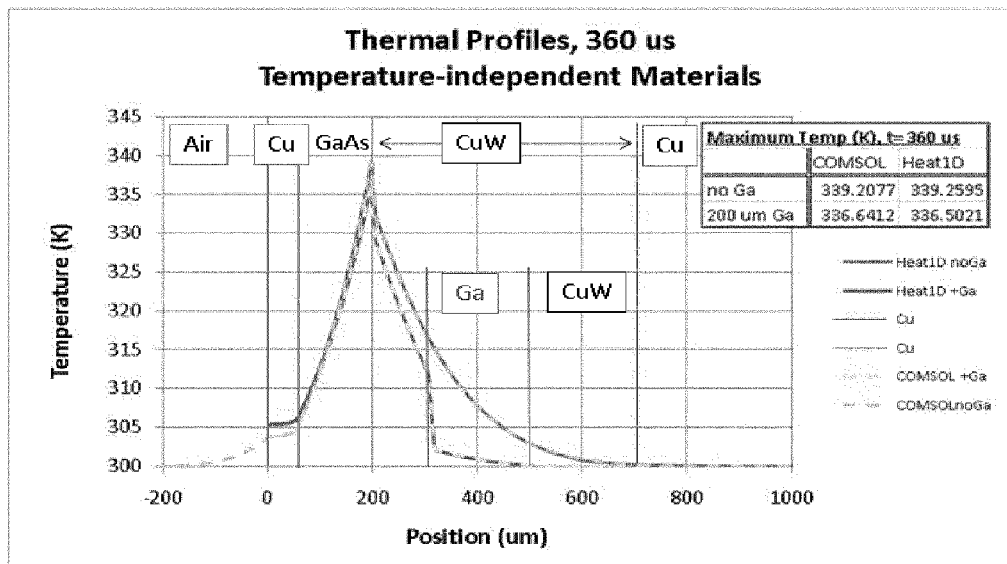
FIG. 6 is a graph illustrating spatial temperature profile of a laser diode package according to an embodiment of the present invention.
FIG. 7 is a table illustrating the correlation of lid thickness to reduction in junction temperature of a laser diode package according to an embodiment of the present invention.
FIG. 8 is a table illustrating the correlation of lid thickness and reservoir height to reduction in junction temperature of a laser diode package according to an embodiment of the present invention.

The choice of heat absorption metal, the relative heights of the reservoir and the lid, and the operation mode of the laser diode significantly impact the manner in which the laser diode can be cooled. It is not merely a matter of design choice to arrive upon the dimensions and choice of materials. It would not be obvious to one skilled in the art to arrive upon the described dimensions and materials without extensive study of the materials and exhaustive analysis of the impact of these materials and dimensions on the cooling efficiency for the laser diode. For example, FIG. 6 illustrates a graph that shows the spatial temperature profile of a laser diode assembly after a 360 μs, 500 W heat pulse with a 100 μm lid and when using no Gallium and using a 200 μm thick Gallium reservoir. The vertical lines in the graph show interfaces between different materials, e.g., Cu, CuW, GaAs, Ga, Cu, etc. As seen in FIG. 6 a reduction in junction temperature, of approximately 3° K is attained when using a 200 μm thick Gallium reservoir. By further adjusting the thicknesses of the Gallium reservoir and the lid, a reduction in junction temperatures of about 7° K can be realized.

As described above, as the solid/liquid interface of the Gallium is situated farther from the diode junction, the reservoir becomes less effective at removing heat due to the increasing thermal impedance from the solid Gallium in the reservoir to the junction. The effect of the moving solid boundary causes a complex time dependence of the junction temperature, which depends on the magnitude of the heat load. At short times, before the reservoir begins to melt, a laser diode assembly without a reservoir performs better due to the better thermal behavior of, e.g., the CuW lid, as compared to Gallium. But, as the Gallium begins to melt, a sharp reduction in the rate of junction temperature rise occurs, and shortly thereafter a laser diode assembly with a reservoir shows improved performance, e.g., reduced junction temperature. In some embodiments, the bottom heat sink, e.g., heat sink 402 of FIG. 4, is operated at a temperature below "ambient" to increase the thermal gradient and heat flow across the Gallium.

FIG. 7 shows a table 700 illustrating the correlation of the lid thickness to reduction in junction temperature according to an embodiment of the present invention. In table 700, the thickness of the Gallium reservoir is kept constant, e.g., 200 μm, while the thickness of the lid is varied. As seen from table 700, thinner lids provide the best thermal performance. In general a lid with thickness less than 100 μm is desirable. FIG. 8 shows a table 800 illustrating junction temperature reduction for a 250 W heat pulse and various heights of reservoirs and thicknesses of the lids. As seen in table 800, a thin reservoir and a thin lid provide enhanced heat dissipation capability and result in improved performance. However, practical aspects like manufacturability of the lids and the reservoirs may limit the thermal performance that can be obtained. In some embodiments, a reservoir depth of less than 250 μm and a lid thickness of less than 100 μm may be used.

Figure 9:
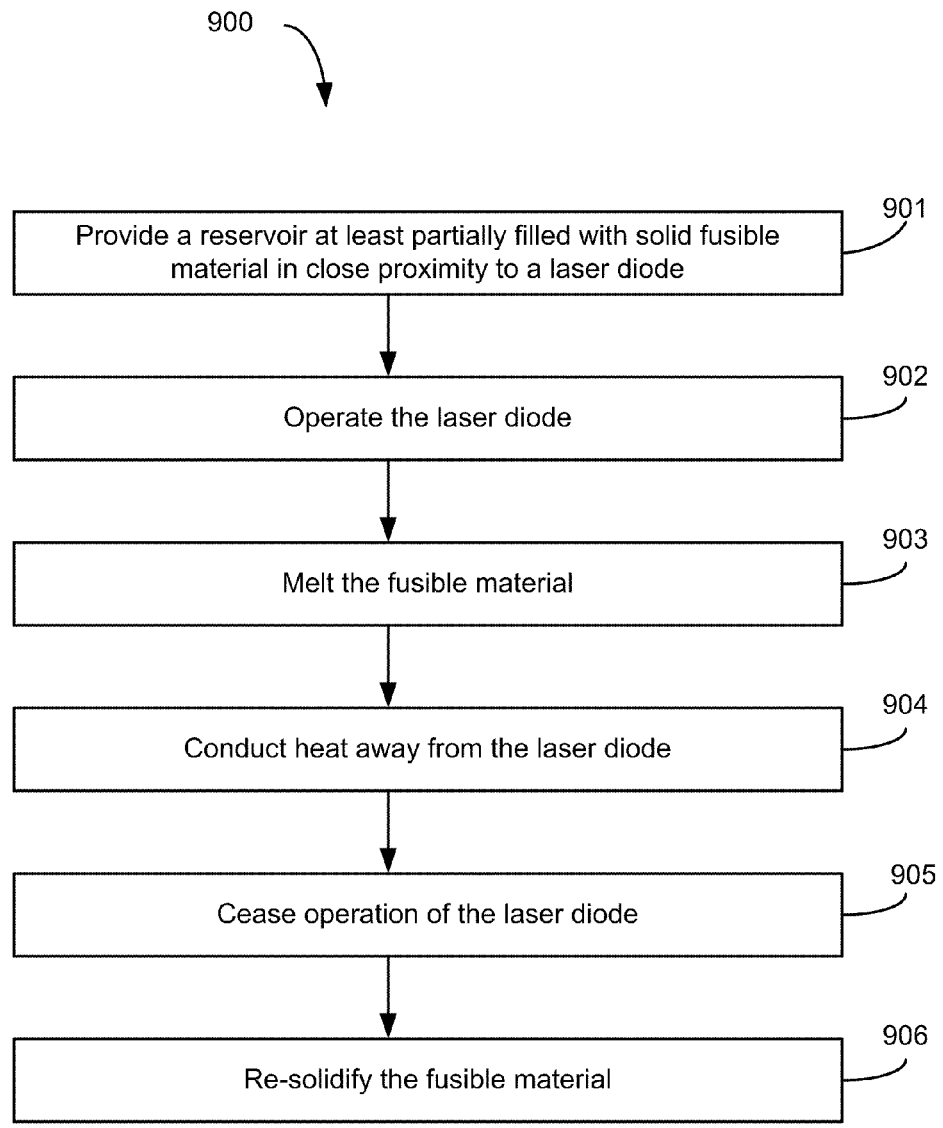
FIG. 9 is a flow diagram for a process for operating a laser diode according to an embodiment of the present invention.

FIG. 9 illustrates a flow diagram for a process 900 of operating a laser diode according to an embodiment of the present invention. At step 901, a reservoir is provided in close proximity to a laser diode. The reservoir is at least partially filled with a solid fusible material, e.g., Gallium. At step 902, the laser diode is operated in a pulsed mode, e.g., with a low duty cycle. At step 903, the fusible material in the reservoir melts as it absorbs the heat generated by the laser diode. The material undergoes a phase transition from solid to liquid. However, the liquid material does not leave the reservoir. As a result of the heat absorption by the fusible material in the reservoir, heat is conducted away from the laser diode at step 904 and the laser diode is cooled. At step 905, the laser diode is turned off. The cooling of the laser diode continues after the laser diode is turned off. At step 906, the fusible material in the reservoir resolidifies, e.g., by conducting the absorbed heat to a heat sink as a result of the cooling. As explained earlier, not all the solid material in the reservoir may melt. Thus, the remaining solid material provides a seed for the remaining melted material to resolidify. After the fusible material resolidifies, it is again ready to absorb heat generated by the laser diode during the laser diode's next operating cycle.

It should be appreciated that the specific steps illustrated in FIG. 9 provide a particular method of operating a laser diode according to an embodiment of the present invention. Other sequences of steps may also be performed according to alternative embodiments. For example, alternative embodiments of the present invention may perform the steps outlined above in a different order. Moreover, the individual steps illustrated in FIG. 9 may include multiple sub-steps that may be performed in various sequences as appropriate to the individual step. Furthermore, additional steps may be added or removed depending on the particular applications. One of ordinary skill in the art would recognize many variations, modifications, and alternatives.

Various advantages are realized by the embodiments of the present invention. For instance, a latent heat reservoir, as described above, can reduce the maximum temperature rise in a laser diode junction. For example, for heat pulses of between 250 W and 500 W with duration of between 200 μs and 1000 μs, the junction temperature can be improved by about 3° K to 7 K in planar structures. The fin structures improve the performance of the latent heat reservoir by achieving up to 9° K improvement in junction temperature when compared to a junction mounted directly on a Copper heat sink without the fin structures.

In some embodiments, the laser diode assembly according to any one of the embodiments, e.g., laser diode assembly 200 of FIG. 2, described above may be implemented in a v-basis package, e.g., the v-basis package 100 of FIG. 1. As described in relation of FIG. 1, a v-basis package provides the means for mounting multiple laser diode bars in a single package. Each of the laser diode bars can have multiple laser diode assemblies included and each of the laser diode assembly can be any of the embodiments described above. For example, laser diode bar 22 of FIG. 1 may include multiple laser diode assemblies according to any of the embodiments described above.

Although the present disclosure describes heat absorption by a metal during phase change from solid to liquid, many other types of phase change materials can also be used. For example, materials that absorb heat during phase change from liquid to gas can also be used to carry heat away from the laser diode. There are many types of material that may be suitable for use in heat abatement via liquid to gas phase transition. For example, some of the materials that can be used in such a liquid to gas phase transition for absorbing heat include water (in a low pressure environment), acetone, tetrahydrofuran, diethyl ether, methylene chloride, methanol, penthane, hexane, and an azeotropic mix of water and ethanol.

It should be noted that the examples and embodiments described herein are for illustrative purposes only and that various modifications or changes in light thereof will be suggested to persons skilled in the art and are to be included within the spirit and purview of this application and scope of the appended claims.

What is claimed is:

1. A laser diode device comprising:
   a substrate having a lower surface and an upper surface, wherein a height of the substrate is defined by a distance between the lower surface and the upper surface;
   a region disposed within the substrate and including a fusible metal characterized by a solid state and a liquid state, the region having an upper surface and an opposing lower surface, wherein the upper surface of the region is flush with the upper surface of the substrate and the lower surface of the region is separated from the upper surface of the region by a first distance that is less than the height of the substrate;
   a cover plate disposed on the substrate, the cover plate having a top surface and a bottom surface in contact with the upper surface of the substrate and the upper surface of the region; and
   a laser diode coupled to the top surface of the cover plate, wherein when in the liquid state the fusible metal is confined within the region during operation of the laser diode.

2. The laser diode device of claim 1 wherein the fusible metal includes Gallium.

3. The laser diode device of claim 1 wherein the fusible metal is an alloy including material chosen from a group comprising Gallium, Indium, Bismuth, and Tin.

4. The laser diode device of claim 1 further comprising a porous Copper plate with the fusible metal embedded in the Copper plate, wherein the Copper plate is placed in the region.

5. The laser diode device of claim 1 wherein the substrate comprises Copper and Tungsten.

6. The laser diode device of claim 1 wherein the cover plate includes Copper or Diamond.

7. The laser diode device of claim 1 wherein a width of the region is more than the first distance.

8. The laser diode device of claim 1 wherein the first distance is between 30 and 70 microns.

9. A laser diode package comprising:
   a mount substrate having a lower surface, an upper surface, and a first height;
   a region disposed within the mount substrate along the upper surface and filled with Gallium, the region having a second height that is less than the first height of the substrate;
   a cover plate disposed on the substrate, the cover plate having a top surface and a bottom surface, wherein the cover plate includes a plurality of fin structures along the bottom surface, the plurality of fin structures extending into the region and in contact with the Gallium and having a height and a width; and
   a laser diode bar coupled to the top surface of the cover plate.

10. The laser diode package of claim 9 wherein the number of the fin structures ranges between 50 and 250.

11. The laser diode package of claim 9 wherein the cover plate comprises Copper, Tungsten, or Diamond.

12. The laser diode package of claim 9 wherein the width of each of the fin structures is between 30 μm and 50 μm.

13. The laser diode package of claim 9 wherein the height of each of the fin structures is between 100 μm and 200 μm.

* * * * *